(12) United States Patent
Weiss

(10) Patent No.: US 7,564,554 B2
(45) Date of Patent: Jul. 21, 2009

(54) WAFER-BASED OPTICAL PATTERN RECOGNITION TARGETS USING REGIONS OF GRATINGS

(75) Inventor: Martin N. Weiss, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 11/480,601

(22) Filed: Jun. 30, 2006

(65) Prior Publication Data

US 2008/0002213 A1 Jan. 3, 2008

(51) Int. Cl.
*G01B 11/00* (2006.01)

(52) U.S. Cl. ...................................... 356/401
(58) Field of Classification Search ......... 356/399–401, 356/625; 430/2, 22, 30
See application file for complete search history.

(56) References Cited

U.S. PATENT DOCUMENTS

| | | | | |
|---|---|---|---|---|
| 3,663,221 | A * | 5/1972 | Higgins et al. | 430/7 |
| 6,458,605 | B1 * | 10/2002 | Stirton | 438/7 |
| 6,699,624 | B2 * | 3/2004 | Niu et al. | 430/5 |
| 7,042,569 | B2 * | 5/2006 | Sezginer et al. | 356/401 |
| 7,061,615 | B1 * | 6/2006 | Lowe-Webb | 356/401 |
| 7,099,010 | B2 * | 8/2006 | Schulz | 356/401 |
| 7,170,604 | B2 * | 1/2007 | Sezginer et al. | 356/400 |
| 7,283,237 | B2 * | 10/2007 | Sezginer et al. | 356/401 |
| 2005/0213072 | A1 | 9/2005 | Schenker et al. | |
| 2005/0285283 | A1 | 12/2005 | Huggins | |
| 2005/0286052 | A1 | 12/2005 | Huggins et al. | |
| 2006/0044568 | A1 | 3/2006 | Weiss | |
| 2006/0238754 | A1 * | 10/2006 | Fukazawa et al. | 356/237.2 |

* cited by examiner

*Primary Examiner*—Hoa Q Pham
(74) *Attorney, Agent, or Firm*—Blakely, Sokoloff, Taylor & Zafman LLP

(57) ABSTRACT

Pattern recognition targets including regions of one or more layers of gratings are used for semiconductor fabrication wafer alignment. Grates of the gratings are below the resolution limit of the alignment microscopes, and have dimensions compatible with design rules applied to actual device circuitry. Targets may be located by the contrast of light reflected and diffracted back from the regions and through a numerical aperture of the microscope. Target contrast may be achieved by controlling the diffractive properties of the regions. A grating with a pitch that causes a significant amount light to diffract out of the numerical aperture will appear darker, while a grating with a pitch that produces minimal diffraction with appear much brighter. Moreover, for a darker causing pitch, a region of layers gratings having grates stacked on each other can appear even darker, while a region having layers of grates interleaved can appear even brighter.

18 Claims, 10 Drawing Sheets

LAYER 2 PATTERN (TOP DOWN)

INTERLEAVED GRATING PATTERN FORMED FROM LAYER 1 AND LAYER 2 (CROSS SECTION)

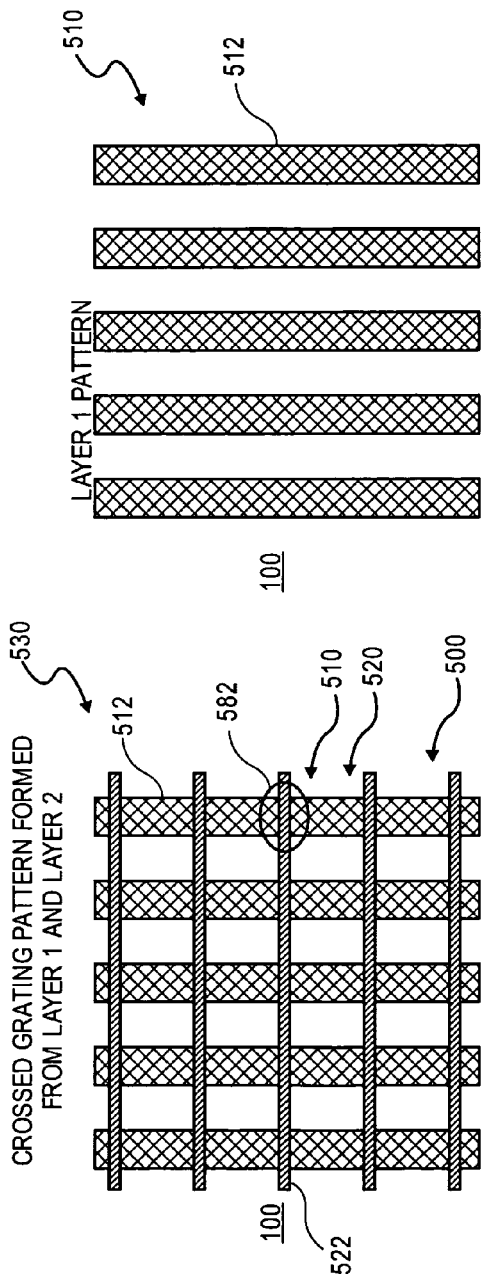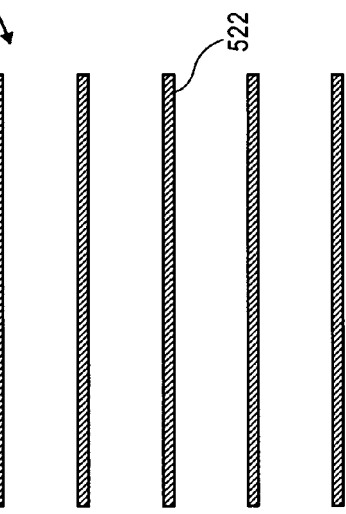

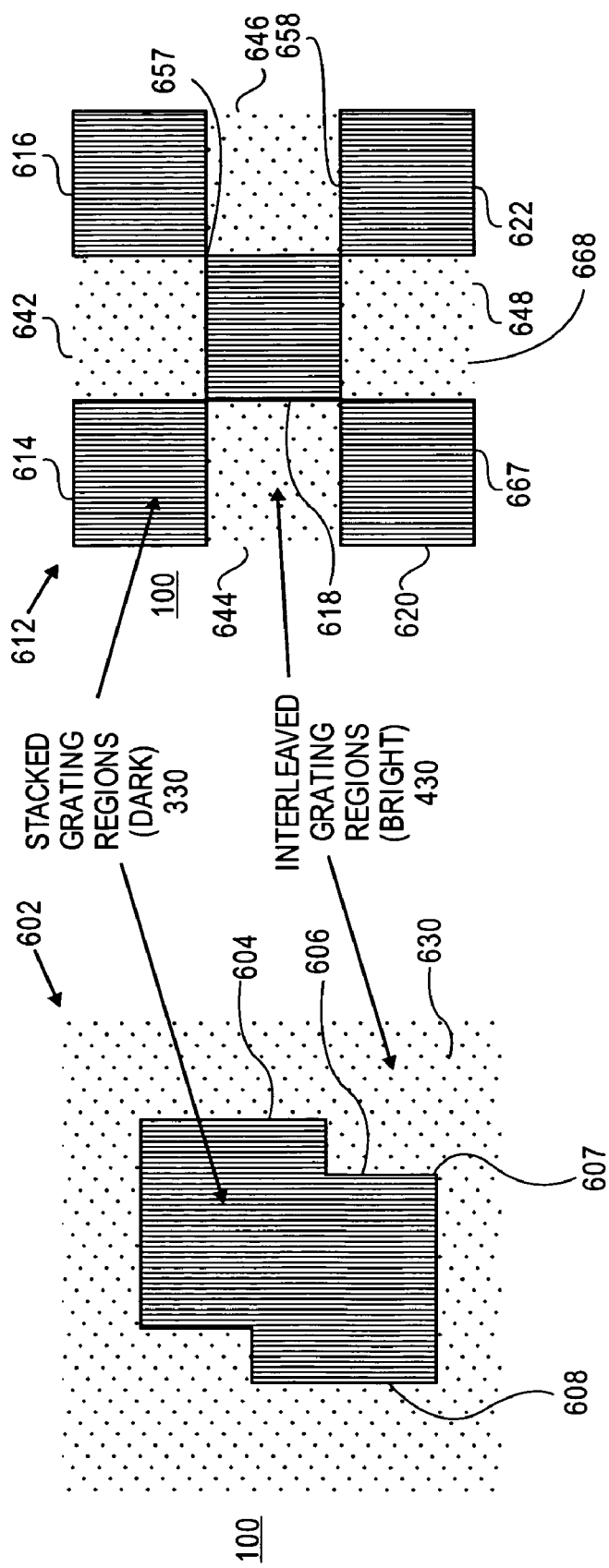

WAFER-BASED OPTICAL PATTERN RECOGNITION TARGETS USING REGIONS OF GRATINGS

BACKGROUND

1. Field

Semiconductor device fabrication processing and more particularly optical pattern recognition targets for indexing wafers during device fabrication processing.

2. Description of Related Art

During semiconductor device fabrication processing numerous (e.g., hundreds of) integrated circuit chips or die, each having millions of electronic devices, may be formed on a single semiconductor wafer. The wafer may be a thin disk or round slice of semiconductor material (e.g., silicon), such as to provide a semiconductor (e.g., silicon, germanium, or a combination thereof) or semiconductor on insulator (SOI) substrate on or in which to form the electronic devices.

Similarly, targets (e.g., wafer alignment optical targets) may be formed on or in layers of the wafer to accurately align the wafers for processing to form the devices (and to form the targets). A large number of semiconductor device fabrication processing tools perform some level of basic alignment on semiconductor wafers prior to processing them. Alignment may be used to determine a radial, rotational, two dimensional, three dimensional and/or a coordinate system based position or location on the wafer. The fabrication process may include a device fabrication process to form circuit features or structures of electronic devices (e.g., to form gate structures, diffusion regions, sources, drains, dielectric layers, gate spacers, shallow trench isolation (STI), integrated circuits, conductive interconnects, metal or alloy features, metal or alloy traces, metal or alloy contacts, and the like of transistors, resistors, capacitors and the like). The device fabrication process may include forming layers of circuitry or circuit features in or on layers of the wafer. The fabrication process may end with a dicing process to separate or "saw" the wafer into distinct chips or die. To accurately align the wafer to form the electronic device circuitry at proper locations (e.g., regions or portions of the wafer surface and/or layers below the surface), a wafer scanning (e.g., a wafer inspection or alignment) process may be used during the device fabrication process, and/or dicing process. The inspection or alignment process typically includes locating one or more optical pattern recognition targets to index the wafer.

Wafer alignment is typically accomplished by using pattern recognition software to locate specific targets, structures, or features on wafers and then correcting for wafer position relative to the tool's wafer stage. Examples of such equipment include scanner, critical dimension scanning electron microscopy (CDSEM), litho registration, defect inspection, and film thickness tools. In general, the alignment systems used on these tools are based on optical microscopes (e.g., alignment or inspection microscopes). In order for the pattern recognition to be successful, the target structures need to have sufficiently high optical contrast relative to their surrounding background. In some process technologies, targets are created by lithographically patterning large, isolated solid features (few tens of microns in size) on wafers. These pattern recognition targets are constructed from large patterns arranged in some unique shape. For some fabrication process technologies, the large patterns may have defect issues due to line-width and/or critical dimension (CD) control requirements. For example, in some fabrication process technologies, linewidth and CD control requirements dictate very tight control of solid feature size and pattern density in order to enable the patterning process and avoid defect issues. For example, use of large, non-design rule-compliant solid features in some fabrication technologies would result in polish (e.g., chemical mechanical polishing (CMP) to planarize a surface of the wafer) dishing, film delamination, and/or defect generation, depending on the layer. These structures tend to be incompatible with such rules given that they need to be fairly large in order to be observable under an alignment microscope.

BRIEF DESCRIPTION OF THE DRAWINGS

The features, aspects, and advantages of the invention will become more thoroughly apparent from the following detailed description, appended claims, and accompanying drawings in which:

FIG. 5A is a schematic top perspective view of a region of a wafer showing a crossed grating arrangement.

FIG. 5B is a schematic top perspective view of a region of a wafer showing an individual grating of a crossed grating.

FIG. 5C is a schematic top perspective view of a region of a wafer showing an individual grating of a crossed grating.

FIG. 6A is a schematic top perspective view of an example of a pattern recognition target (e.g., structure) having gratings in regions of a wafer that may be used for wafer alignment.

FIG. 6B is also a schematic top perspective view of an example of a pattern recognition target (e.g., structure) having gratings in regions of a wafer that may be used for wafer alignment.

DETAILED DESCRIPTION

Figure 1:
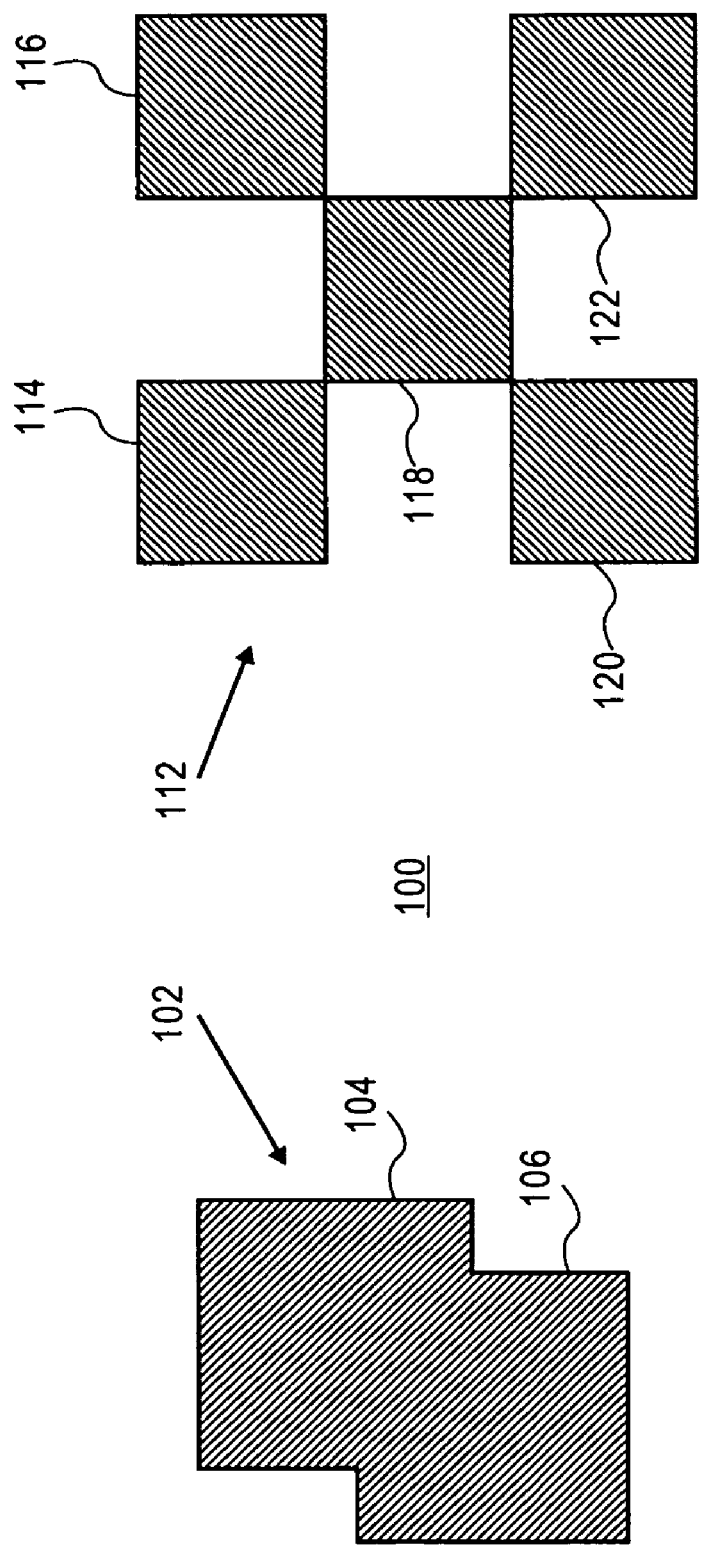
FIG. 1 is a schematic top perspective view of examples of pattern recognition targets in regions of a wafer that may be used for wafer alignment.

FIG. 1 is a schematic top perspective view of examples of pattern recognition targets (e.g., structures) in regions of a wafer that may be used for wafer alignment. The targets may be constructed from large patterns or structures of solid features arranged in some unique shape on or in wafer 100 (e.g., on a surface or topmost surface of wafer 100). For instance, FIG. 1 shows target 102 as a large structure having solid features 104 and 106 (e.g., solid features are not formed of gratings as mentioned below, but of solid flat layers of a single material in each region of the wafer surface).

Similarly, FIG. 1 shows target 112 as a large structure having solid features 114, 116, 118, 120, and 122. Each of features 104, 106, 114, 116, 118, 120, and 122 may be larger than the minimum resolution size (e.g., are greater than a best resolution limit possible) of a wafer alignment system inspection microscope (e.g., each of those features may be larger than a minimum size pixel the optical inspection microscope can focus on, thus the microscope can "see", focus on, or identify those features and their location). In some cases, each of features 104, 106, 114, 116, 118, 120, and 122 may be larger or equal to a 100 microns squared ($\mu m^2$) area. Thus, the microscope is able to clearly see, form an image of, or identify each features shape and edges.

However, in some fabrication process technologies, linewidth and critical dimension (CD) control requirements dictate very tight control of feature size and pattern density in order to enable the patterning process and avoid defect issues. For example, use of large, non-design rule-compliant features in some fabrication technologies would result in polish (e.g., chemical mechanical polishing (CMP) to planarize a surface of the wafer) dishing, film delamination, and/or defect generation, depending on the layer of the wafer the feature is in or on. The structures shown in FIG. 1 tend to be incompatible with such rules given that they need to be fairly large in order to be observable under an alignment microscope. Specifically, any or all of features 104, 106, 114, 116, 118, 120, and 122 may experience polish dishing, cause film delamination, and/or cause wafer defect generation.

Thus, according to embodiments, pattern recognition targets including one or more layers of gratings (e.g., instead of a flat surface of a single material, a layer of grating has grating features such as grates of a single material, another different material between the grates, and/or spaces between the grates) can be used with or instead of targets having only single material solid features. For instance, solid features, such as solid features 104 and 106 of FIG. 1, may be distinguished from grating features such as grates of a grating formed of a single material, a potion of a grate, another material between the grates, and/or space between the grates. Specifically, features 104 and 106 may each have a single material surface that is flat, excludes gratings, excludes grates, excludes a pitch, and/or otherwise diffracts substantially no light back into an optical microscope (e.g., less than 5 percent of the incident light is diffracted back into the microscope for imaging).

Consequently, wafer alignment may be accomplished by using pattern recognition software to locate (e.g., to "see", focus on, find, and/or identify) specific targets or target features having gratings in or on wafers and then correcting for wafer position relative to the tool's wafer stage. Such targets, features, and or gratings may be described as in, on, of, or for a wafer. For instance, a wafer processing tool (e.g., a semiconductor device fabrication processing tool) may include a wafer alignment system having an inspection microscope to inspect a wafer "surface" (e.g., the topmost surface as well as and/or layers below the topmost surface) by radiating or exposing the surface to light (e.g., incident light through a numerical aperture of the system or microscope and onto the surface) and collecting, receiving and/or measuring the light reflected and diffracted back to the system or microscope (e.g., back through or within the numerical aperture). The light may be white light, have a specific wavelength spectrum or color, and/or including or have a "centroid wavelength". The targets and/or features may be identified and/or located by the brightness, darkness and/or contrast between brightness and darkness of light reflected back from regions of or areas of one or more layers of gratings. The alignment system may align the tool with a wafer, and/or a portion, region, and/or field of the wafer sufficiently for the tool to be able to accurately and successfully perform device fabrication processes at the portion, region, and/or field of the wafer.

Also, the appearance of the alignment targets described herein may be controlled primarily by the pitch and positioning of the gratings of each layer relative to each other. Although the individual grating features (e.g., dimensions) forming the gratings may be below the resolution limit of the alignment microscopes, contrast may be achieved by controlling the diffractive properties of the grating. In other words, a region of grating may be detectable by an inspection microscope, even though the grates, material and/or space between the grates (e.g., grates or features of a grating) of the grating have physical dimensions (e.g., width) that are smaller or below the minimum resolution size of an inspection microscope (e.g., smaller than the minimum size pixel, solid feature, or grating feature the microscope can form an image of, such as on a screen). The detection may be possible because the region has a uniform or consistent "dark", "bright" or "gray" brightness detected by the microscope as compared to adjacent regions, which may have a different brightness and/ or which may define an edge between the regions. For example, a grating comprised of a pitch that causes a significant amount light to diffract out of the numerical aperture (NA) of an alignment microscope will appear dark, while a grating comprised of a pitch that produces minimal diffraction with appear much brighter. Since gratings are used to form the target, rather than the conventional large isolated solid features described for FIG. 1, the pattern recognition target can be selected to be as large as needed, provided semiconductor fabrication process compatible linewidths and pitches are used to form the gratings and pattern densities are used to form the gratings, as is explained further below. Since the grating structures may be drawn with the same design rules (e.g., for linewidths, pitches and pattern densities) applied to actual device circuitry, they may automatically be compatible with the wafer fabrication process. Note, as described herein, "selecting" something may include choosing and/or designing dimensions, materials, pitches, and the like, such as to achieve a desired or intended function or capability, and may include consideration of various factors.

Figure 2:
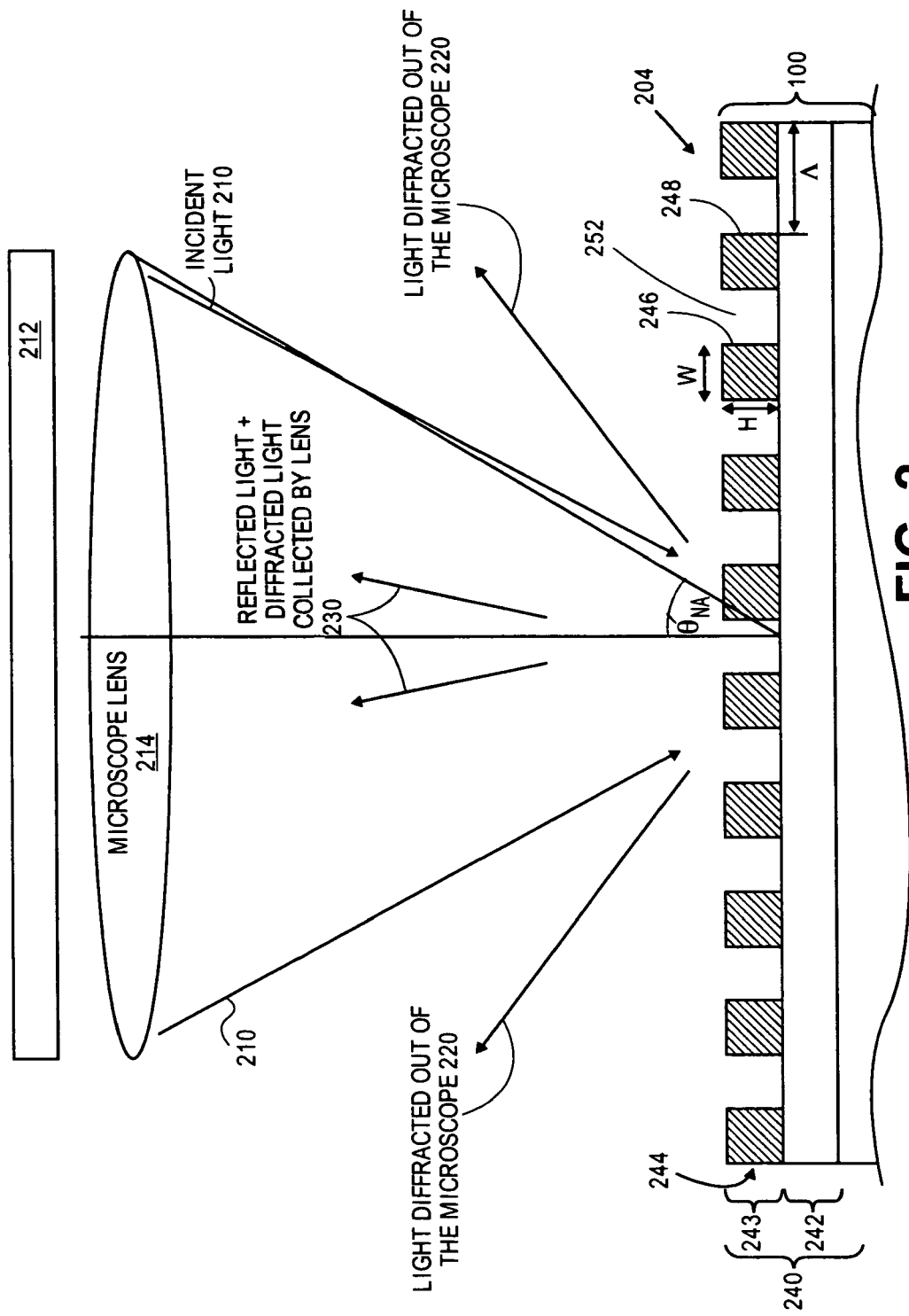
FIG. 2 is a schematic cross-sectional view of a region of a wafer and an alignment microscope showing alignment microscope geometry.
Figure 3A:
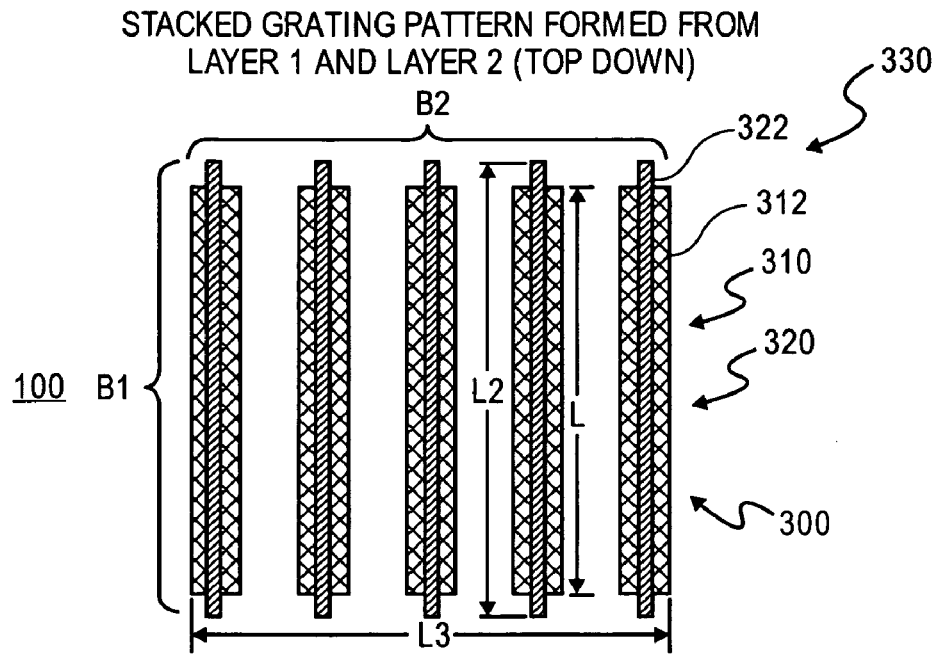
FIG. 3A is a schematic top perspective view of a region of a wafer showing a stacked grating arrangement.

For instance, FIG. 2 is a schematic cross-sectional view of a region of a wafer and an alignment microscope showing alignment microscope geometry. FIG. 2 shows wafer 100 having surface 240 including layer 243 and layer 242. Layer 242 may be considered a substrate, as known in the art (e.g., a substrate having circuitry or transistor features in or on that substrate). Grating 244 is shown formed in layer 243 and on layer 242. Grating 244 includes grate 246 and grate 248, and space 252 between grates 246 and 248. Grate 246 is shown having width W and height H. Grate 246 may have length L as shown in FIG. 3A. For example, grates of grating 244 have pitch A. A pitch of a grating may be described as a distance between and edge of a grate of the grating (e.g., the beginning or end edge of a grate) and the corresponding edge of the next grate (or between each adjacent two grates). Thus, a pitch A may define a uniform spacing for or between each grate, such as the distance of width W, plus space 252 perpendicular to length L. Wafer 100 has topmost surface 240, such as a surface including the outer surfaces of grates of grating 244, and the topmost surface of layer 242.

Source 212 may provide incident light (IL) 210 having an appropriate wavelength, intensity, and focus (e.g., via lens 214) to illuminate or penetrate the surface (e.g., the topmost surface and/or layers below the topmost surface) of wafer 100, including targets, grating features and/or gratings formed in or on layers of the wafer. Source 212 is shown generating or radiating light through lens 214 to create IL 210 incident upon all the layers of wafer 100 having target regions or gratings formed therein or thereon.

FIG. 2 also shows $\theta_{NA}$ such as the largest angular spread of light from the surface 240 that lens 214 can collect or detect. In some case, $\theta_{NA}$ may be defined between a line perpendicular to surface 214 (and extending through the center of source 212) and the outer edge or perimeter of lens 214. Source 212 and/or lens 214 may be part of an alignment system or inspection microscope having a numerical aperture (NA) that is $\sin^{-1}$ of the largest angular spread of light from the surface 240 that lens 214 can collect or detect. According to embodiments, for FIG. 2, the NA (e.g., a microscope having lens 214) may be determined according to the equation:

$$NA = \sin^{-1}\theta_{NA}. \quad (1)$$

It is considered that NA may be a fixed value such as 0.01, 0.02, 0.04, 0.08, 0.1, 0.2, 0.4, 0.8, a combination thereof, or in a range between any valued or combination of values thereof. In some case, NA may be between 0.3 and 0.9, or in a range between 0.2 and 0.8.

Incident light 210 is shown incident upon surface 240 and being diffracted and reflected. Part or portion of light 210 (e.g., a percentage of the total illumination or energy of light 210) is diffracted into light diffracted out of the microscope 220 (e.g., at angles exceeding the NA (e.g., out of or away from the NA) so that it is not collected by the microscope). Alternatively, a different part or portion of light 210 (e.g., a different percentage of the total illumination or energy of light 210) is reflected light+diffracted light collected by lens 230 (e.g., at angles not exceeding the NA (e.g., into or through the NA) so that it is collected by the microscope). Specifically, all of the light of light 220 and light 230 may equal the same amount of light of incident light 210 less a different third part or portion of light 210 (e.g., absorption loss) that is absorbed by the material of wafer 100 (such that the total illumination or energy of light 210 is conserved). Absorption loss may be proportional to the grating and/or substrate dimensions, shape, profile, and/or material. Thus, some of the light diffracted by surface 240 is diffracted into light 220 and some of it is diffracted into light 230. All of the light reflected by surface 240 is reflected into light 230. More particularly, light 230 equals the amount of reflected light collected by lens 214 having numerical aperture NA, and all of the diffracted light collected by lens 214 having numerical aperture NA.

Referring to FIG. 2, incident light 210 shines on a diffraction grating. Part of the diffracted light 220 falls outside the numerical aperture (NA) of the lens and is lost. The grating and substrate also absorb part of the incident light. The remainder (reflected light+diffracted orders inside the NA of the lens) is collected and imaged.

When light shines on a grating, it diffracts according to the equation:

$$\theta_n = \sin^{-1}(n\lambda/\Lambda - \sin\theta_i) \quad (2)$$

where $\theta_n$ is the diffracted angle, $\theta_i$ is the incident angle, $\Lambda$ is the pitch of the grating, $\lambda$ is the wavelength of the light, and n is the diffraction order, equal to $0, \pm 1, \pm 2, \ldots$ In cases where the light source is part of the inspection microscope (i.e. part of the alignment system of a semiconductor fabrication tool) with a numerical aperture of NA, then the condition $\theta_n > \sin^{-1}(NA)$ causes the $n^{th}$ diffracted order to scatter out of the NA of the microscope (e.g., causing the $n^{th}$ diffracted order to not be received by the microscope). Specifically, for gratings, light diffracted may be scattered at discrete angles with respect to its incident upon the surface of a wafer/substrate. The light collected by the microscope (e.g., the light reflected plus the light diffracted into the NA) may be described by:

Collected light=incident light−absorption losses in grating and substrate−diffraction loss (3)

and shown schematically in FIG. 2 by reference to reflected light+diffracted light collected by lens 230. If the diffraction loss (i.e. light diffracted outside the numerical aperture of the microscope) is high enough, then the grating region will appear dark. We achieve this condition by appropriately selecting the pitch of the grating relative to the incident light wavelength and NA of the microscope. Similarly, when the pitch of the grating is small enough, then no diffraction occurs and most of the incident light is reflected back into the microscope, resulting in the grating region appearing bright.

Light considered herein includes light that has light intensity spread over a large light frequency spectral bandwidth (e.g., such as by having light intensity across a large wavelength range bandwidth of frequencies and colors, such as for "white light"). Also, because light may be used that has a light intensity spread over a limited light frequency bandwidth narrow range of wavelengths (e.g., such as by having light intensity across a range of wavelengths bandwidth of frequencies, as large as about two percent of the center wavelength selected or desired frequency of the light), it is useful to describe the frequency of such incident light IL, in terms of "centroid wavelength". A centroid wavelength may represent a wavelength at which is located the mean value across the bandwidth of the intensity of light used or radiated (e.g., by a source). A centroid wavelength may also be called a "wavelength" (designated by the symbol "$\lambda$") or "$\lambda$" of the light. For instance, according to embodiments, inspection light (e.g., incident light from through a NA of an inspection microscope) may use a centroid wavelength typically between 300 nm and 2000 nm. A centroid wavelength of 0.1. 0.2, 0.4, 0.8, 1.0, 2.0 micro-meters, any combination thereof, or a range of between any wavelengths and/or combination thereof. For example, the centroid wavelength may be between 300 nano-meters and 900 nano-meters.

Also the pitch of an individual grating may be equal to or greater than 0.05, 0.1. 0.2, 0.4, 0.8, 1.0, 2.0 micro-meters, any combination thereof, or a range of between any pitches and/or combinations thereof. For example, the pitch may be between 150 nano-meters and 450 nano-meters, and/or greater than one half of the centroid wavelength. Moreover, pitch may be between 200 nano-meters and 5000 nano-meters.

According to embodiments, targets, gratings, and/or grating features can be sized to work with optical microscope-based wafer alignment systems, such as those typically utilized in fabrication metrology equipment. Specifically, the light reflected may be a function of light absorbed and/or diffracted by gratings in the topmost material surface, and/or in layers below the actual topmost material surface of the wafer. Thus, herein a "surface" of a wafer may include solid features, grating features, gratings, and/or circuitry formed or existing on the topmost surface as well as on layers below the actual topmost material surface of the wafer, that absorb and/or diffract light incident upon the wafer (e.g., incident upon and passing through the actual topmost material surface of the wafer).

The inspection microscope can include an optical microscope having a minimum resolution size (e.g., the minimum size pixel, solid feature, or grating feature the microscope can form an image of, such as on a screen). The microscope may be unable to detect features or targets having a size smaller than its minimum resolution size. The individual or single grates and/or material between the grates may be smaller in width than a minimum resolution size (e.g., smaller than a best resolution limit possible) of a wafer alignment system inspection microscope. For instance, each of those widths may be smaller than a minimum size pixel the optical inspection microscope can form an image of or focus on. Thus the microscope is unable to "see", form an image, focus on, or identify the individual or single grates and/or material between the grates (e.g., the image of the single grates, features, edges, spacing, and/or material thereof blurs on the screen so that identification of a single grate of edge thereof can not be identified by a user). However, the microscope may be able to detect a region of a target having solid and/or grating features by the darkness, brightness of the region (e.g., the blur of adjacent grates of a region) or the contrast of that region as compared to an adjacent region or region close bye. Software may used to analyze the image (e.g., the light received and/or detected, such as light 230), such as a computer program. Such a program or software may be computer instruction contained on a machine-accessible medium (e.g., magnetic medium, optical medium, and/or digital memory) that can be executed by a processor, such as a processor of a computer.

It is contemplated that the inspection microscope may travel above or along the surface of the wafer to pre-determined or pre-defined sampling locations. The locations may be selected or analyzed so that the shortest overall distance is traveled to visit all of the locations. In some cases, the travel may be "side to side" to adjacent locations in a "row" until the row is complete, and then the next row (e.g., above or below the current row) may be traveled in the same "side to side" manner.

For instance, the physical dimensions of the gratings and/or grating features can be selected (e.g., are intended) to reflected and/or diffract sufficient brightness, darkness and/or contrast (e.g., a border between brightness and darkness) of light from regions of the "surface" back to the microscope to be identified and/or located by an optical microscope-based wafer alignment systems. Moreover, multiple layers of gratings can be used to take advantage of the grating pattern to create optical contrast (i.e. contrast between bright and dark regions).

Also, a grating may be described as or included in a structure or a target. A grating may be formed in a region or area of the "surface" of a wafer (e.g., a region as defined by a geometric footprint, shape, or portion from a top perspective view of the topmost surface of the wafer). A target may include one or more regions or structures of gratings on one or more layers of the wafers. Herein a "pattern" may describe a target, a grating, a region of grating(s), or other circuitry formed in or on a layer of a wafer.

For instance, regions of gratings may be formed on layers of the wafer, where the gratings may or may not overlap or be on each other. Moreover, the grating features (e.g., the grates, material between the grates, and/or spacing between the grates) can have physical dimensions (e.g., length, cross-sectional shape, height, and/or width) that comply with, are according to, consider, have dimensions compatible with semiconductor device fabrication process linewidths and pitches, and/or pattern densities. In some cases, being compatible includes not exceeding the linewidth or pitch design rule limitations for forming actual device circuitry. Also, being compatible with pattern densities may include not exceeding the pattern density design rule limitations for forming actual device circuitry. For example, being compatible with pattern densities may include having patterns (e.g., gratings regions) in regions covering a range of between 40 and 60 percent of a pattern density sized area of concern of the wafer. It is considered that grating features may have physical dimensions (e.g., width) compatible with fabrication process technology linewidth and critical dimension (CD) control requirements (e.g., such as feature size and pattern density). More particularly, grating features may have physical dimensions that are larger than CD requirements. Moreover, grating features may have physical dimensions that are not greater than and are not less than the feature sizes selected or designed according to the circuitry design rule for fabricating circuitry devices on the wafer. Thus, the targets, regions, gratings, grates, and/or grating features including or formed with gratings may avoid defect issues, such as those that result in polishing dishing, film delamination, and/or defect generation.

Hence, targets having regions of the multiple layers of gratings (e.g., bright regions adjacent to dark regions), rather than the traditional large isolated solid features that are typically used for this purpose, can be formed with a wide range of linewidth and density design rules (e.g., only the grates or grating features have to comply with or be formed according to the linewidth and density design rules). This flexibility means that the grates or grating features of a layer of a target can be formed on any layer (or only on a layer) of a wafer where the grates or grating features fall within, comply with, or are according to the linewidth and/or density design rules for processing to form circuitry or transistor features on that layer. In other words, during processing on a layer to form circuitry or transistors having transistor features that comply with or are according to linewidth and/or density design rules that are within a rule range for forming the gratings, a region or regions of such gratings (e.g., regions of one or more targets) can be formed on that layer as well.

For instance, one grating may be formed during first lithographic patterning process for forming semiconductor device circuitry features, and a second grating may be formed adjacent to, above, or below the one grating during a different, separate, and/or second lithographic patterning process for forming semiconductor device circuitry features in or on the wafer. Optical lithography, imprint lithography (mechanical stamping), and the like are considered lithographic patterning processes. Moreover, such a first and/or second process may be part of a device fabrication process, a wafer inspection or alignment process, and/or a dicing process. Such a device fabrication process may include one or more of a process included during isolation forming (e.g., during an STR process and/or during forming of an STI), during gate forming (e.g., during a PLY process and/or during forming of a gate stack), during implant forming (e.g., during an NTP process and/or during forming of a doped region). Such a device fabrication process may also include processes performed when forming circuit features or structures of electronic devices (e.g., forming a layer of semiconductor, a layer of dielectric, a layer of insulator, a layer of conductor, a gate structures, diffusion regions, sources, drains, dielectric layers, gate spacers, shallow trench isolation (STI), integrated circuits, conductive interconnects, metal or alloy features, metal or alloy traces, metal or alloy contacts, and the like of transistors, resistors, capacitors and the like); and/or a process performed by a fabrication scanner, critical dimension scanning electron microscopy (CDSEM), litho registration, defect inspection, and film thickness tool.

Similarly, gratings may be thought of to include the space, air, gas and/or material formed between the grates. For instance, it is considered that material (e.g., semiconductor, dielectric, conductor, and the like used to form or when forming electronic devices) may be formed or deposited (e.g., such as by being grown, layered, formed by chemical vapor deposition, and the like used when forming electronic devices) between grates of gratings. Thus, grates or gratings may be described as target regions or gratings formed in or on a layer of a wafer.

Spaces between grates (e.g., whether filled with space, air, gas or material) may have dimensions (e.g., selected dimensions) similar to those described for grates or grating features.

Specifically, gratings may be described as in or on a layer, such as gratings 244 shown "in" layer 243 (e.g. layer 243 may include space, air, gas or material between grates, such as grate 246 and 248) but "on" layer 242 of FIG. 2. As such, gratings 244 may be described as formed "in" topmost layer 243 of material 204 of wafer 100, but "on" wafer layer 242 of wafer 100. Thus, as shown in FIG. 2, "surface" 240 of wafer 100 may be gratings 244 (e.g., material 204) with space between the grates (such as space 252 between grates 246 and 248) and the top of layer 242. Alternatively, if material is formed or exists in space between the grates (e.g., if space 252 between grates 246 and 248 is filled with material) that material may be considered part of grates 244 and the top of that material may be considered part of surface 240 (and part of topmost layer 243 of material 204).

Moreover, FIG. 2 shows grates 246 and 248 adjacent to each other and separated by space 252. Grates may be described as lines or strips (e.g., parallel stripes) of material having a length (e.g., see length Λ of FIG. 3A) along the surface of a wafer and having a cross sectional shape with a height and a width, where the length is greater than the width. For instance, FIG. 2 shows grate 246 having height (H) and width (W).

Each grate may be a line, strip or shape etched in, removed from, or formed of wafer material, semiconductor, dielectric, conductor, photoresist, or other material used to form electronic devices. For instance, wafer-level pattern recognition targets can be created by lithographically patterning superimposed grating structures (e.g., gratings) onto or into a wafer surface, such as using photolithography. For example, photolithography may be a multi-operation pattern transfer process wherein a pattern contained on a reticle, photo mask, etch mask, or multi-layers mask is transferred onto the surface of a wafer or substrate through a lithographic imaging operation, and a light sensitive material (e.g., photoresist) is developed on the wafer.

A grate of a grating (e.g., grate 246) may be described as having dimensions of shape, height, length and width. For instance, a grate may have dimensions of length L, a cross-sectional shape (e.g., the square cross-sectional shape of grate 246), height H, and/or width W that comply with, are according to, consider, have dimensions compatible with semiconductor device fabrication process linewidths and pitches, and/or pattern densities. In some cases, being compatible includes not exceeding the fabrication process technologies, linewidth, pitch, and critical dimension (CD) control requirements (e.g., such as circuit, transistor or device feature size and pattern density). The same can be said for dimensions of grating features (e.g., grates and/or the spacing between two grates).

For instance, a height of a grate or grating (e.g., height H) may be a height between 150 nanometers and 0.5 micrometer. Also, a height of a grate or grating may be 0.05, 0.1, 0.2, 0.4, 0.8, 1.0, 2.0 micrometers, any combination thereof, or in a range between any height and/or combinations thereof. Likewise, a width of a grate or grating (e.g., width W) may be a width between 150 nanometers and 0.5 micrometer. Also, a width of a grate or grating may be 0.05, 0.1, 0.2, 0.4, 0.8, 1.0, 2.0 micrometers, any combination thereof, or in a range between any widths and/or combinations thereof. Also, a length of a grate or grating (e.g., length L) may be a length between 0.5 micrometers and 20 micrometers. Also, such a length may be a length of 0.2, 0.3, 0.4, 0.8, 1.0, 2.0, 4.0, 8.0, 10, 20, 40, 80, micrometers, any combination thereof of in length, or in a range between any lengths and/or combinations thereof. Specifically, according to embodiments, a region (e.g., herein a "regions" may describe a region of one or more gratings) may have a size of at least 10 microns in at least one direction (e.g., a border length or length of a side of 10 microns), a diffraction efficiency of at least 20 percent, and a duty cycle of no more than 80 percent.

Also, a region (e.g., containing grates 244) may have an area of between 20 microns and 1000 microns. For example, a region may have an area (e.g., footprint from a top perspective view) of 50 to 100 microns squared ($\mu m^2$) and/or a pitch of between 300 nanometers and 1 micrometer.

Gratings may have a pitch (e.g., pitch Λ of FIG. 2, that is a similar or constant distance between each last or falling edge of adjacent grates) that is between 300 nanometers and 1 micrometer. Also, a pitch of a grating may be 0.1, 0.2, 0.4, 0.8, 1.0, 2.0, 4.0 micrometers, any combination thereof, or may be in a range between any pitches and/or combinations thereof. It is considered that the pitch of a grating may be proportional to the centroid wavelength of the incident light. In some cases, as noted above, the pitch Λ, of an individual grating may be between 200 nano-meters and 5000 nano-meters, and/or greater than or equal to one half of the centroid wavelength. For embodiments where the pitch of a grating is less than half the centroid wavelength, the region may appear bright, regardless of whether the grating is stacked, interleaved, crossed, or just an individual grating because most of the incident light will be reflected (and diffracted) back into the NA. For example, for an individual grating having pitch greater than half incident light centroid wavelength, diffraction out of the NA will be greater than for an interleaved grating, for example, and the grating will appear dark (and as explained below, stacked gratings will appear even darker, but interleaved gratings will appear most bright). Moreover, for pitch greater than half incident light centroid wavelength, diffraction out of the NA will be greater for an individual, stacked, or crossed grating than it will be for an interleaved grating having the same or a substantially similar pitch as the individual gratings used to form the interleaved grating. This is because for the interleaved grating the effective pitch (e.g., of the combined interleaved individual grates reflecting the incident light) is less than half the centroid wavelength and, thus, most of the incident light is reflected back into the NA.

However, less incident light is diffracted overall for the interleaved grating (e.g., there is less total light diffracted back through the NA and diffracted outside the NA than for an individual, stacked, or crossed grating). Pitch substantially proportional to wavelength may be defined as equal to or within 1, 2, 4, 8, 10 percent, any combination thereof, or in a range between any percents and/or combinations thereof of the incident light.

A grate or grating may have a duty cycle (e.g., W/Λ) of between 0.1 and 0.9. It is also contemplated that embodiments have a duty cycle between 0.2 and 0.8, such as a duty cycle of 25%, 30%, or 50%. Although not limiting, according to embodiments, 50% duty cycle may be optimal. In some cases, a grate or grating may have a duty cycle of 0.05, 0.1, 0.2, 0.3, 0.8, any combination thereof, or in a range between any duty cycles and/or combinations thereof.

Sometimes, a grating may be a number of parallel or substantially parallel grates. Gratings may include more than one, two, four, five, eight, ten, twenty, forty, eighty, any combination thereof, or a range between any numbers and/or combinations thereof of grates (e.g., and a similar number minus one, of spaces between the grates). Each grate may be aligned or disposed exactly parallel or substantially parallel to each other grate. Substantially parallel may describe where each grate is aligned or disposed at an angle of between other than zero (e.g., other than exactly parallel) and between zero and $1/10$, $1/5$, $1/4$, $1/3$, $1/2$, one, two, three, any combination thereof, or in a range between any degrees and/or combinations thereof of degrees from being exactly parallel to each other grate.

Also, a grating may be a set or sequence of at least 5 grates having a pitch. Thus, two layers of gratings may be at least 5, 10, 20 or more first grates having a first pitch and at least 5, 10, 20 or more second grates having a second pitch, and the first pitch is within 0.1, 0.2, 0.4, 0.8, 1.0, 2.0 percent, any combination thereof, or a range of between any percentages or combination of percentages thereof of the second pitch. Any of such percentages may define pitches that have a substantially similar pitch (e.g., to each other). Similarly, grates of two layers of gratings may oriented parallel or perpendicular to each other by within 0.1, 0.2, 0.4, 0.8, 1.0, 2.0 percent, any combination thereof, or in a range between any percents and/or combinations thereof. Any of such orientations may be described as substantially parallel or substantially perpendicular to each other.

Similar dimensions may be applied to the depth, width, and length for the spacing or other material formed between two grates.

Moreover, although it is desired for dimensions of gratings to comply with those of circuit, transistor or device feature size and pattern density rules, motives and factors for selecting exact dimensions and pitch of features of gratings and of gratings may be distinguished from those for selecting dimensions of circuit, transistor or devices. For example, while motives and factors for selecting exact dimensions of circuit, transistor or devices may be related to electrical performance or characteristics. On the other hand, in some cases, motives and factors for selecting exact dimensions and pitch of grating features and of gratings (e.g., and for formation thereof) may include or be related to optical characteristics such as reflection properties, diffraction properties, index of diffraction, diffraction efficiency, reflection index, refractive index, duty cycle, and the like. According to embodiments, motives and factors for selecting exact dimensions and pitch of grating features may exclude motives and factors for selecting exact dimensions of circuit, transistor or devices. Motives and factors for selecting exact dimensions grating features may also apply to selecting layer of gratings in a region, such as to select stacked, interleaved, and/or crossed gratings as described herein.

Specifically, for wafer fabrication processes that have tight linewidth and pattern density design rules at multiple process layers, grating may be used to form or create an alignment target composed of a multi-layer stack of design rule-compliant gratings (e.g., regions of gratings). In addition, advantage can be taken of the diffractive properties of gratings to produce wafer-level structures (e.g., regions of multiple layers of gratings) with high optical contrast by arranging these structures to form a pattern recognition targets.

This flexibility means that the grates or gratings can be easily formed (e.g., without additional processing "steps" or processes) during processing to form circuitry or transistors having features according to linewidth and density design rules that are within the range for the gratings.

Moreover, grates or grating features of one grating may be formed, created, disposed or oriented parallel, at an angle, or perpendicular to grates or grating features of another grating that the first grating is superimposed upon (e.g., the one grating is over).

For instance, FIGS. 3A, 3B, 3C, 3D, and 3E are schematic views of a region of a wafer showing stacked grating arrangements, and individual gratings of stacked grating arrangements. For example, individual gratings from layer 1 (see FIG. 3B) and layer 2 (see FIG. 3C) may have the same pitch and may be positioned such that the line/space patterns from each grating land directly on one another (see FIGS. 3A, 3D, and 3E). In the stacked structure, the superposition of multiple individual gratings increases the diffraction efficiency of the structure. In some cases herein, an "individual grating" will simply be referred to as a "grating". An individual grating may be a single layer of grating (e.g., a "normal" grating) having multiple grates and spaces or material between the grates, and/or a layer of grates forming a grating as otherwise described herein. Specifically, a number of individual gratings, each having multiple single grates, may be combined on, or over one another so that at least a portion of the single grates of each layer are superimposed or superpositioned above each other.

For instance, applying the theory discussed above, a dark regions on a wafer can be created by (1) defining gratings with the same pitch on reticles for several different process layers, (2) printing these gratings on the wafer using conventional lithography (3) arranging these gratings such that when printed on a wafer, the pattern or grating features (e.g., individual grates) from all of the gratings land directly on top of one another. This configuration is shown in FIGS. 3A, 3D and 3E and is referred to as a "stacked grating." Each grating in the stack has a pitch that causes it to appear dark in the alignment microscope (i.e., diffracts a significant amount of light outside the NA of an inspection microscope). In order to ensure the stacked grating appears uniformly dark, the grating pitches (e.g., the size of each line/space pattern or grating feature) may be below the resolution limit of the inspection microscope. By stacking the individual grating features (e.g., grates) directly on top of each other, the diffraction efficiency of the region (i.e. amount of light coupled into the diffracted orders) of the composite grating structure is increased. This increases the diffraction loss and makes the composite structure appear even darker than the individual gratings (e.g., most diffracted incident light is diffracted out or away from NA so that it is not collected by the microscope). Specifically, these gratings may be below the resolution limit of the inspection microscope, have the same pitch, and be positioned such that the pattern or grating features (e.g., grates) from each layer (diffusion line, PLY line, etc.) land directly on top of one another. The pitch of the individual gratings is selected such that it causes some, most, or substantially all of the incident light from the inspection microscope to diffract out of the numerical aperture of the microscope.

More particularly, FIG. 3A is a schematic top perspective view of a region of a wafer showing a stacked grating arrangement. FIG. 3A shows stacked grating 330 including pattern 310 and pattern 320 (e.g., such as where each pattern describes a grating or region of grating in a layer of the wafer). Grating or pattern 310 includes grate 312 and grating 320 includes grate 322. Pattern 320 may be described as stacked on or superimposed above, over, or on pattern 310. Similarly, grate 322 may be described as stacked on or superimposed above, over, or on grate 312. Grate 312 is shown having length L and grate 322 is shown having length L2. Length L may be equal to, greater than, or less than length L2. The longer of length L and length L2 will define the length or distance of border B1 of region 300. Similarly, length L3 is shown extending perpendicular to lengths L and L2. Length L3 will define the other length or distance of border B2 of region 300. According to embodiments, stacked gratings may increase diffraction efficiency and cause more light to be diffracted out of a lens NA than would be accomplished/diffracted by one individual grating having the same or a substantially similar pitch.

Figure 3B:
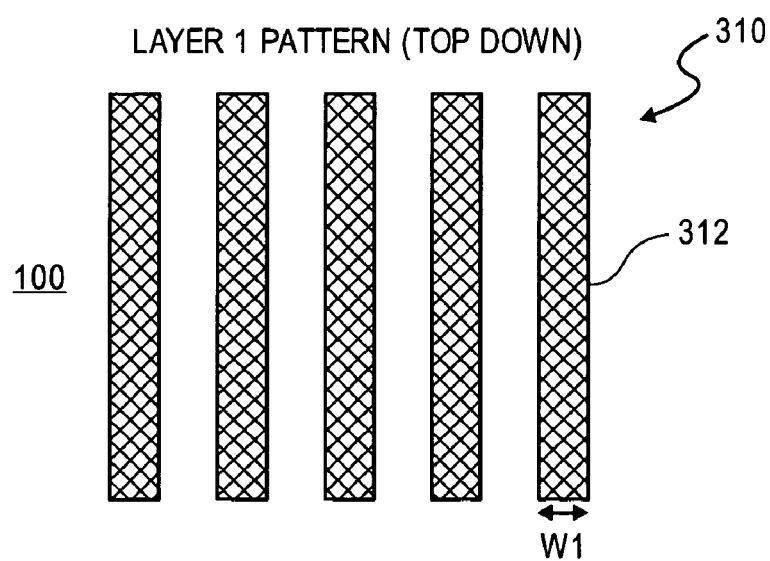
FIG. 3B is a schematic top perspective view of a region of a wafer showing an individual grating of a stacked grating.

FIG. 3B is a schematic top perspective view of a region of a wafer showing an individual grating of a stacked grating. FIG. 3B shows pattern 310 including grate 312 having width W1. Pattern 310 may be described as a grating or region of grating in a layer of wafer 100.

Figure 3C:
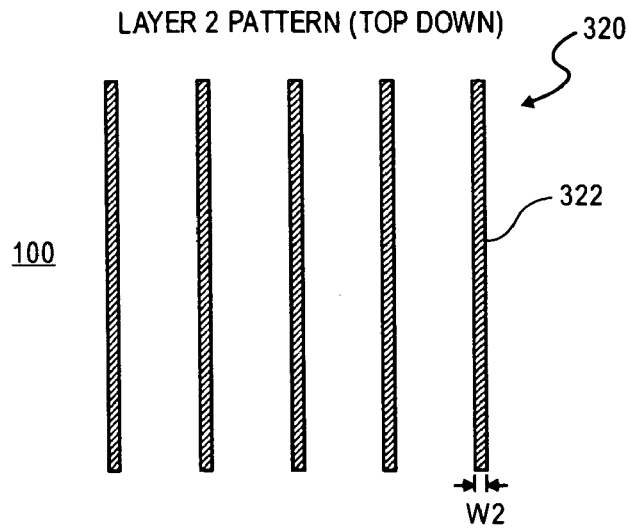
FIG. 3C is a schematic top perspective view of a region of a wafer showing an individual grating of a stacked grating.
Figure 3D:
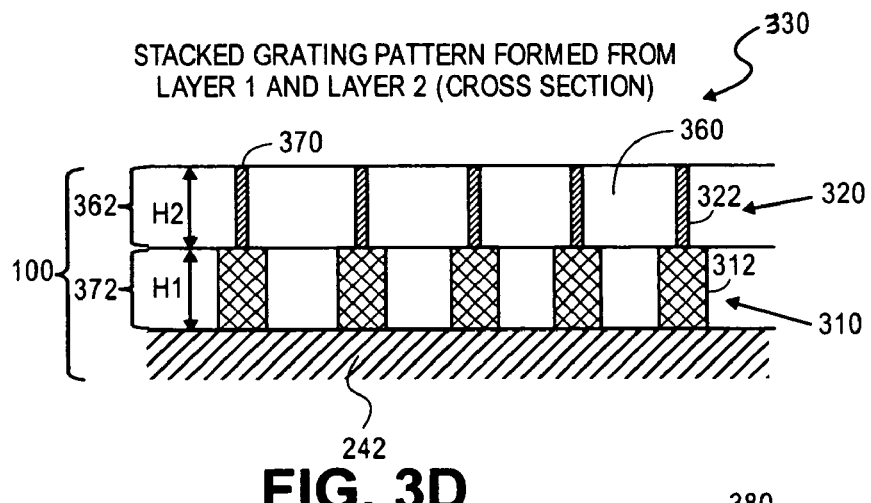
FIG. 3D is a schematic cross-sectional view of a region of a wafer showing a stacked grating arrangement.
Figure 3E:
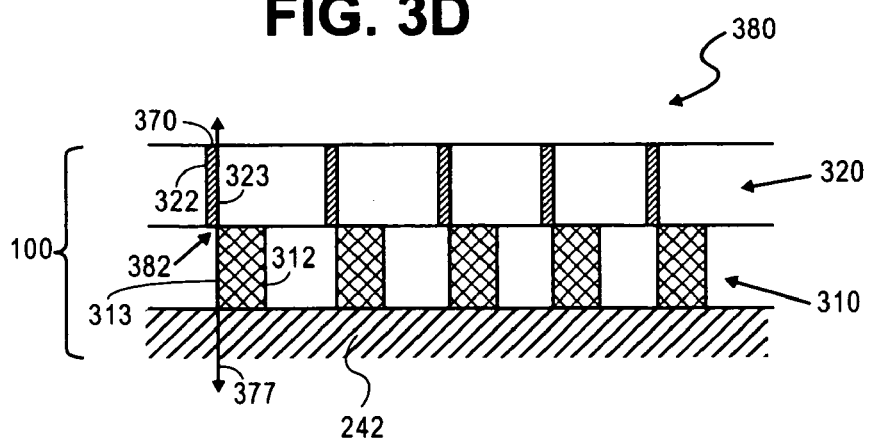
FIG. 3E is a schematic cross-sectional view of a region of a wafer showing a stacked grating arrangement.

FIG. 3C is a schematic top perspective view of a region of a wafer showing an individual grating of a stacked grating. FIG. 3C shows pattern 320 having grate 322 having width W2. Pattern 320 may be described as a grating or region of grating in a layer of wafer 100.

FIG. 3D is a schematic cross-sectional view of a region of a wafer showing a stacked grating arrangement. FIG. 3D shows stacked grating 330 including pattern 320 on or superimposed over pattern 310. Pattern 320 includes grate 322 and may be described as grating (e.g., including grate 322) formed in layer 362 and on layer 372. Similarly, pattern 310 includes grate 312 and may be described as grating (e.g., including grate 312) formed in layer 372 and below layer 362. Pattern 310 and grate 312 have height H1. Similarly, pattern 320 and grate 322 have height H2. Width W1, height H1, and length L of pattern 310 (as well as spacing between the grates of pattern 310) may be equal to or correspond to physical dimensions described above with respect to grating 244, height H, width W, and space 252.

FIG. 3D shows pattern 320 formed on pattern 310, such as where grate 322 is on, or over or touching grate 312, where layer 362 is adjacent to or touching layer 372. It is also contemplated that layer 362 may not be adjacent to or touching layer 372, such as where layers of wafer 100 are disposed between and separate layer 362 from layer 372 such that layer 362 does not touch layer 372. For example, layer 362 may be a layer one layer away, two layers away, four layer, eight layers away, any combination thereof, or a in range between any number of layers and/or combinations thereof of layers away from layer 372. Layer 372 is shown formed on layer 242, which may be considered a substrate, as known in the art. In some cases, layer 362 may be the topmost layer of wafer 100 such that topmost surface 370 of layer 362 is the topmost surface of wafer 100.

FIG. 3D also shows space 360 which may be a space similar to space 252 of FIG. 2. Space 360 may be filled with matter, such as dielectric, conductor, or semiconductor. The matter in space 360 may be optically opaque or clear. Also, the matter in space 360 may have an optical characteristic such that incident light 210 transmits or passes through space 360 with substantially no absorption as compared to interaction of incident light 210 with the matter of grate 322 and/or grate 312 (e.g., as compared to light diffracted out of the NA, such as light 220). It is also contemplated that a stacked grating may exist where pattern 310 formed on pattern 320, such as where grate 312 is on, or over or touching grate 322.

FIG. 3E is a schematic cross-sectional view of a region of a wafer showing a stacked grating arrangement. FIG. 3E may represent a "worse case" or limiting stacked grating where there is minimal overlap of grates of single gratings of one layer over or upon grates of single gratings of another layer. FIG. 3E shows stacked grating 380 including pattern 320 on pattern 310, but having grating oriented, disposed, or spaced differently with respect to pattern 310 than that shown in FIG. 3D. For example, at point 382, vertical line 377 passing perpendicular to surface 370 passes through or touches only inner edge 323 of grate 322 and passes through or only touches outer edge 313 of grate 312. In this arrangement, grate 322 is still considered in, over, or superimposed above grate 312, such that pattern 320 (e.g., grating features of pattern 320) are stacked on pattern 310 (e.g., stacked on grating features of pattern 310).

It is considered, in some cases, that stacked gratings may have grates that are vertically aligned exactly over one another so that all the width of a grate of one layer is within all of the width of a grate of another layer. Also, stacked grates may be proportionally aligned over one another so that a portion of the width of a grate of one layer is within all of the width of a grate of another layer. Next, stacked grates may be barely aligned over one another, such as shown in FIG. 3E.

FIGS. 4A, 4B, 4C, 4D, and 4E are schematic views of a region of a wafer showing interleaved grating arrangements, and individual gratings of interleaved grating arrangements. For example, individual gratings from layer 1 (see FIG. 4B) and layer 2 (see of FIG. 4C) may have the same pitch and may be positioned such that the line/space patterns from each grating land in between on one another (see FIGS. 4A, 4D, and 4E). The interleaved structure, the superposition of multiple individual gratings creates a composite grating with half of the pitch of either of the individual gratings.

For instance, a bright region can be created by (1) defining gratings with the same pitch on several different process reticles, (2) printing these gratings on the wafer using conventional lithography, and (3) positioning these gratings such that the pattern or grating features (e.g., grates) from each grating fall in between the features (e.g., grates) of the other grating. This configuration in shown in FIGS. 4A, 4D and 4E and is referred to as an "interleaved grating". Interleaving the grating features (e.g., grates) produces a composite grating that effectively has half of the pitch of the either of the original gratings. For example, if each of the individual gratings had a pitch of 320 nm, then the diffractive properties of the composite structure approximate those of a grating with a pitch of 160 nm. By interleaving the individual grating features (e.g., grates) of layers on top of each other, the diffraction efficiency of the region (i.e. amount of light coupled into the diffracted orders) of the composite grating structure is decreased. This decreases the diffraction loss and makes the composite structure appear even brighter than the individual gratings (e.g., most diffracted incident light is diffracted into the NA so that it is collected by the microscope). This enables access to smaller pitches to produce optically bright regions without requiring state-of-the-art lithography. Again, the pitch of the individual gratings may be below the resolution limit of the inspection microscope to produce a uniform appearance. Specifically, these gratings may be below the resolution limit of the inspection microscope, have the same pitch, and be positioned such that the pattern or grating features (e.g., grates) from each grating layer (diffusion line, PLY line, etc.) land between the features of the other gratings. The pitch of the individual gratings is selected such that it causes the layers of interleaved gratings to have an effective or constructive pitch that is half of the pitch of the either of the original gratings to cause some, most, or substantially all of the incident light from the inspection microscope to diffract into the numerical aperture of the microscope. For example, as compared to an individual, stacked, or crossed grating, the effective pitch (e.g., of the combined interleaved individual grates reflecting the incident light) causes more of the incident light to be reflected back into the NA, and less of the light to be diffracted overall. In some cases, the effective pitch may be less than half incident light centroid wavelength.

Figure 4A:
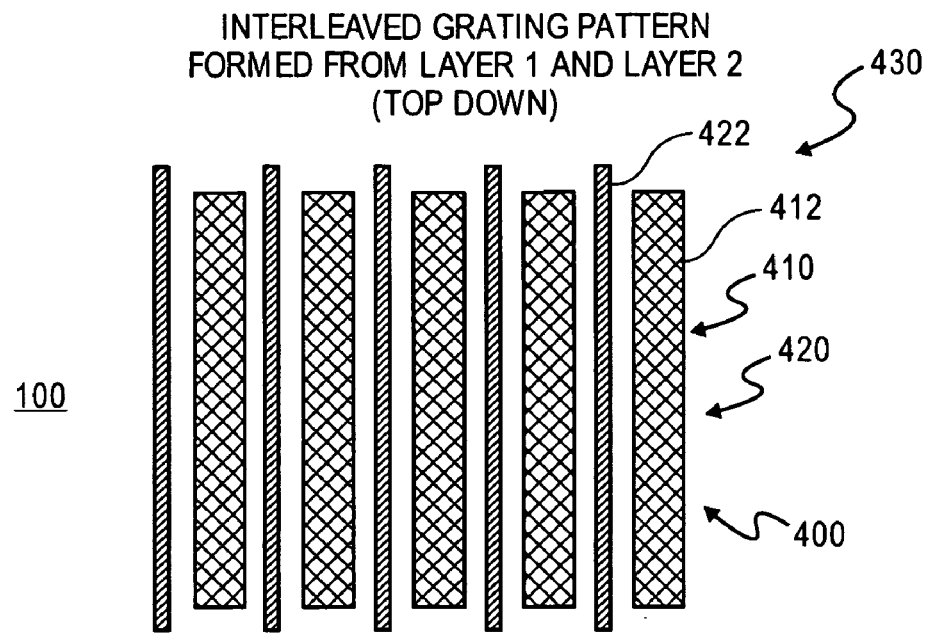
FIG. 4A is a schematic top perspective view of a region of a wafer showing an interleaved grating arrangement.

More particularly, FIG. 4A is a schematic top perspective view of a region of a wafer showing an interleaved grating arrangement. FIG. 4A shows interleaved grating 430 including pattern 410 and pattern 420 (e.g., such as where each pattern describes a grating or region of grating in a layer of the wafer). Grating or pattern 410 includes grate 412 and grating 420 includes grate 422. Pattern 420 may be described as interleaved above, over, or on pattern 410. Similarly, grate 422 may be described as interleaved between and/or not touching grate 412 and another grate. Grate 412 and grate 422 may have dimensions (e.g., shape, height, width, and length) and/or define borders of region 400, as described above for grates 312 and 322 respectively. According to embodiments, interleaved gratings may reduce an amount of light diffracted out of a lens NA and increase an amount of light reflected back within a lens NA as compared to individual, stacked, or crossed gratings having the same or a substantially similar pitch as the individual gratings used to form the interleaved grating.

Figure 4B:
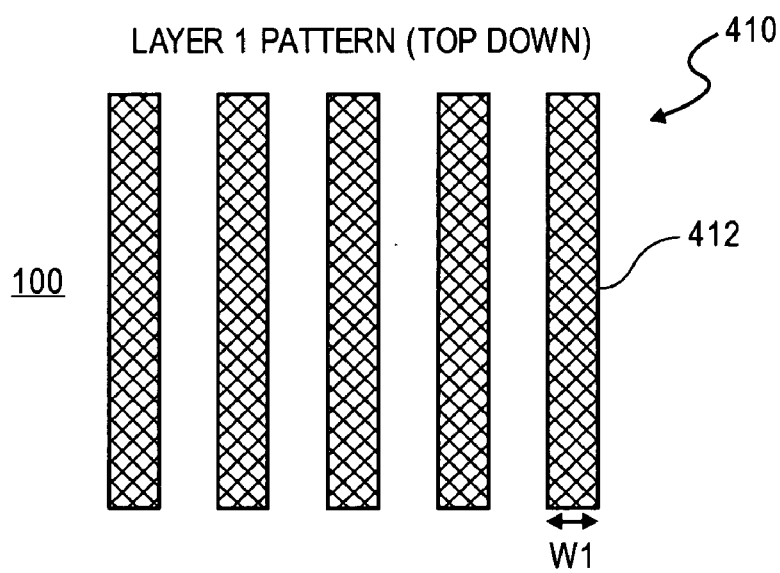
FIG. 4B is a schematic top perspective view of a region of a wafer showing an individual grating of an interleaved grating.

FIG. 4B is a schematic top perspective view of a region of a wafer showing an individual grating of an interleaved grating. FIG. 4B shows pattern 410 including grate 412. Pattern 410 may be described as a grating or region of grating in a layer of wafer 100.

Figure 4C:
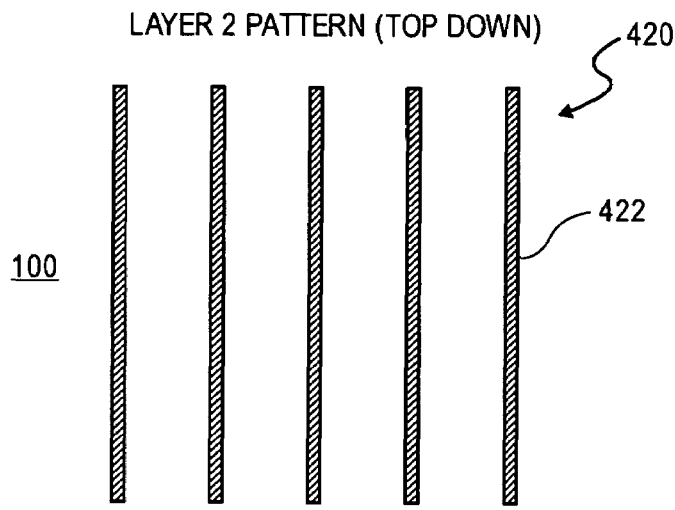
FIG. 4C is a schematic top perspective view of a region of a wafer showing an individual grating of an interleaved grating.

FIG. 4C is a schematic top perspective view of a region of a wafer showing an individual grating of an interleaved grating. FIG. 4C shows pattern 420 having grate 422. Pattern 420 may be described as a grating or region of grating in a layer of wafer 100.

Figure 4D:
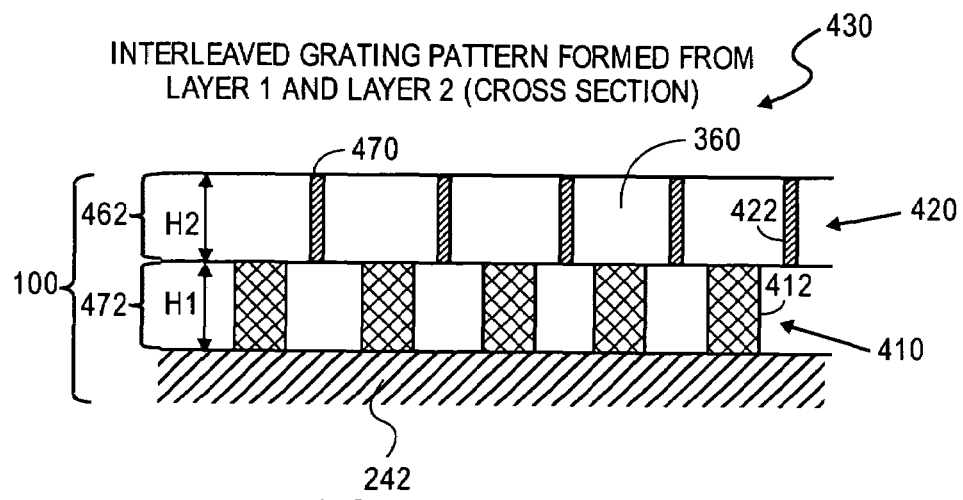
FIG. 4D is a schematic cross-sectional view of a region of a wafer showing an interleaved grating arrangement.

FIG. 4D is a schematic cross-sectional view of a region of a wafer showing an interleaved grating arrangement. FIG. 4D shows interleaved grating 430 including pattern 420 on or interleaved and superimposed over pattern 410. Pattern 420 includes grate 422 and may be described as grating (e.g., including grate 422) formed in layer 462 and on layer 472. Similarly, pattern 410 includes grate 412 and may be described as grating (e.g., including grate 412) formed in layer 472 and below layer 462. Pattern 410 and grate 412 have height H1. Similarly, pattern 420 and grate 422 have height H2. Width W1, height H1, and length L of pattern 410 (as well as spacing between the grates of pattern 410) may be equal to or correspond to physical dimensions described above with respect to grating 244, height H, width W, and space 252.

FIG. 4D shows pattern 420 formed on pattern 410, such as where grate 422 is interleaved with, between, or not touching grate 412. FIG. 4D also shows space 360 and layer 472 formed on layer 242, which may be considered a substrate, as known in the art. In some cases, layer 462 may be the topmost layer of wafer 100 such that topmost surface 470 of layer 462 is the topmost surface of wafer 100.

Figure 4E:
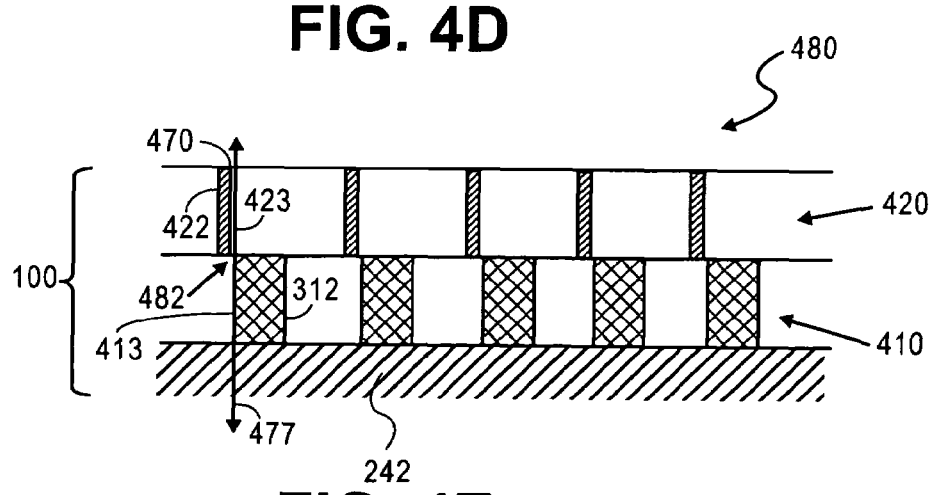
FIG. 4E is a schematic cross-sectional view of a region of a wafer showing an interleaved grating arrangement.

It is also contemplated that an interleaved grating may exist where pattern 410 formed on pattern 420, such as where grate 412 is interleaved between and/or not touching grate 422. FIG. 4E is a schematic cross-sectional view of a region of a wafer showing an interleaved grating arrangement. FIG. 4E may represent a "worse case" or limiting interleaved grating where there is minimal distance between grates of single gratings of one layer over or upon grates of single gratings of another layer.

FIG. 4E shows interleaved grating 480 including pattern 420 on pattern 410, but having grating oriented, disposed, or spaced differently with respect to pattern 410 than that shown in FIG. 4D. For example, at point 482, vertical line 477 passing perpendicular to surface 470 passes through or touches only inner edge 413 of grate 412 and passes by but does not touch outer edge 423 of grate 422. In this arrangement, grate 422 is still interleaved with, on, over, above or between grate 412, such that pattern 420 (e.g., grating features of pattern 420) are interleaved with or between pattern 410 (e.g., interleaved with grating features of pattern 410).

It is considered, in some cases, that interleaved gratings may have grates that are vertically aligned between one another so that the midpoint of the width of a grate of one layer is at the midpoint of space between two grates of another layer. Next, interleaved grates may be barely interleaved, such as shown in FIG. 4E (e.g., just short of being overlapping or stacked). Also, interleaved grates may be proportionally aligned between one another so that the midpoint of the width of a grate of one layer is between the midpoint of space between two grates and a position that causes it to be barely interleaved.

FIGS. 5A, 5B, 5C, and 5D are schematic views of a region of a wafer showing crossed grating arrangements, and individual gratings of crossed grating arrangements. For example, individual gratings from layer 1 (see FIG. 5B) and layer 2 (see FIG. 5C) may be positioned such that the line/space patterns from each individual grating are "crossed" or substantially perpendicular to one another (see FIGS. 5A and 5D).

Figure 5D:
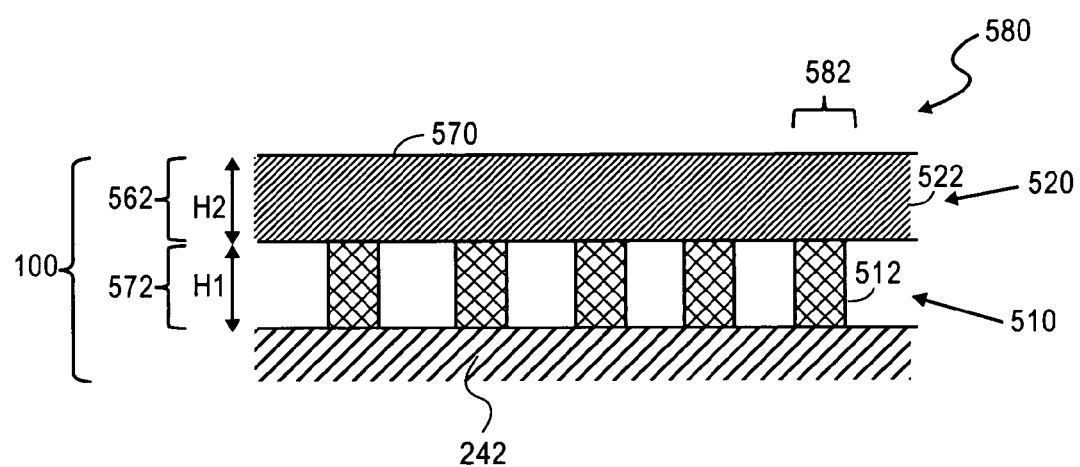
FIG. 5D is a schematic cross-sectional view of a region of a wafer showing a crossed grating arrangement.

For instance, a gray region can be created (i.e. brightness in between the light and dark cases) by superimposing line/space gratings from different patterning layers oriented to be perpendicular to one another as shown in FIGS. 5A and 5D. This enables access to smaller pitches to produce optically gray regions (e.g., a selected brightness between dark and light) without requiring state-of-the-art lithography. Specifically, optically gray regions, with brightness in between that of the dark/light regions mentioned above may be created by superimposing grating arrays (e.g., grates) from multiple process layers on top of each other. These gratings are constructed from line/space patterns and can have any pitch below the resolution limit of the optical microscope (e.g., so as to produce a uniform appearance). The pitch of the individual gratings may be selected such that it causes the layers of crossed gratings to cause some (e.g., a fraction greater than 1/10, 10%, 1/5 or 20%) of the incident light from the inspection microscope to diffract into the numerical aperture of the microscope (e.g., to have a diffraction efficiency of greater than 1/10, 10%, 1/5 or 20%). The grating features may be oriented such that the line/space pattern for one layer is perpendicular to the line/space pattern for another layer. We refer to this as a crossed grating. In some cases, these gratings may have the same pitch, and be positioned such that the pattern or grating features (e.g., grates) from each grating layer (diffusion line, PLY line, etc.) land perpendicular to the features of the other gratings.

More particularly, FIG. 5A is a schematic top perspective view of a region of a wafer showing a crossed grating arrangement. FIG. 5A shows crossed grating 530 including pattern 510 and pattern 520 (e.g., such as where each pattern describes a grating or region of grating in a layer of the wafer). Grating or pattern 510 includes grate 512 and grating 520 includes grate 522. Pattern 520 may be described as crossed above, superimposed over, over, or on pattern 510. Similarly, grate 522 may be described as crossed above, superimposed over, over, or on grate 512. Grate 512 and grate 522 may have dimensions (e.g., shape, height, width, and length) and/or define borders of region 500, as described above for grates 312 and 322 respectively. FIG. 5A also shows cross point 582, such as a point where a portion of grate 522 is over, above, or on grate 512.

FIG. 5B is a schematic top perspective view of a region of a wafer showing an individual grating of a crossed grating. FIG. 5B shows pattern 510 including grate 512. Pattern 510 may be described as a grating or region of grating in a layer of wafer 100.

FIG. 5C is a schematic top perspective view of a region of a wafer showing an individual grating of a crossed grating. FIG. 5C shows pattern 520 having grate 522. Pattern 520 may be described as a grating or region of grating in a layer of wafer 100.

FIG. 5D is a schematic cross-sectional view of a region of a wafer showing a crossed grating arrangement. FIG. 5D shows crossed grating 530 including pattern 520 crossed above, superimposed on, or over pattern 510. Pattern 520 includes grate 522 and may be described as grating (e.g., including grate 522) formed in layer 562 and on layer 572. Similarly, pattern 510 includes grate 512 and may be described as grating (e.g., including grate 512) formed in layer 572 and below layer 562. Pattern 510 and grate 512 have height H1. Similarly, pattern 520 and grate 522 have height H2. Width W1, height H1, and length L of pattern 510 (as well as spacing between the grates of pattern 510) may be equal to or correspond to physical dimensions described above with respect to grating 244, height H, width W, and space 252.

FIG. 5D shows pattern 520 formed on pattern 510, such as where grate 522 is crossed with, over, on or touching grate 512. FIG. 5D also shows layer 572 formed on layer 242, which may be considered a substrate, as known in the art. In some cases, layer 562 may be the topmost layer of wafer 100 such that topmost surface 570 of layer 562 is the topmost surface of wafer 100. It is also contemplated that a crossed grating may exist where pattern 510 formed on pattern 520, such as where grate 512 is crossed on, or over or touching grate 522.

In some cases, the stacked, crossed, and/or interleaved grating may be referred to as "composite grating structures". For instance composite grating structures may describe the composition of various layers of gratings on or over each other, such as those shown above in FIGS. 3A, 3D, 3E, 4A, 4D, 4E, 5A and 5D (as well as for FIGS. 6A, 6B, 7A, and 7B described below). Specifically, each of a stacked, crossed, and interleaved grating has at least first layer of grating as a first component and at least one other layer of grating as a second component on or above the first layer, thus forming a composite grating structure. Also, in some embodiments, first and second gratings do not physically contact, touch, or have electrically conductive contact with electrically conductive features or structures of circuitry on the wafer. Moreover, it is considered that first and second gratings may be inactive or non-active features or devices on a wafer.

The gratings can be formed on multiple layers of the wafer and/or on a photoresist, to provide a target for indexing or alignment. For instance, gratings may be formed or created over, super-positioned on, superimposed on, and/or in a same region with other gratings (e.g., with respect to each other). For instance, a grating feature (e.g., a grate of a grating, space there-between, or potion thereof) that is vertically above another grating feature may be described as being over, on, on top of, above, overlaying, super-positioned on or superimposed on that other grating feature. Vertically above may be when a line that is perpendicular to a surface (e.g., the topmost material surface) of the wafer runs through or touches the grating feature and the other grating feature. It is also considered that a grating feature that is over, on top of, superpositioned or superimposed with respect to another grating feature may physically contact or touch that other grating feature (e.g., such as where they touch at a point on or along the line that is perpendicular to a surface of the wafer).

Similarly, a layer of a wafer and/or a layer of gratings may be formed or created over, super-positioned on, superimposed on, and/or in a same region with another layer (e.g., with respect to each other). For instance, a layer that is vertically above another layer may be described as being over, on, on top of, above, overlaying, super-positioned on or superimposed on that other layer. Vertically above may be when a line that is perpendicular to a surface (e.g., the topmost material surface) of the wafer runs through or touches both layers. It is also considered that a layer that is over, on top of, superpositioned or superimposed with respect to another layer may physically contact or touch that other layer (e.g., such as where they touch at a point on or along the line that is perpendicular to a surface of the wafer).

In some cases a grating will be formed or exist on a layer of the wafer that is adjacent or just above or below another layer of the wafer that contains another grating. Grates or grating features that are adjacent may be touching. In some cases a grating will be formed or exist on a layer of the wafer that is non-adjacent or more than one layer away, just above or below, another layer of the wafer that contains another grating. Multiple layers of gratings that are on adjacent layer and/or non-adjacent layer may be formed on or exist to form a target.

For example, pattern recognition targets can be constructed with the same shape as those shown in FIG. 1 by using stacked gratings for the dark regions and interleaved gratings for the bright regions. Specifically, FIGS. 6A and 6B are schematic top perspective views of examples of pattern recognition targets (e.g., structures) having gratings in regions of a wafer that may be used for wafer alignment. FIG. 6A shows target 602 as a large structure having grating features 604 and 606, and 630. For example, feature 604 and/or 606 may be adjacent to, share a border with, or share a point with adjacent feature 630. Features 604 and 606 have a different type of grating than feature 630. Specifically, features 604 and 606 are stacked gratings while feature 630 is interleaved gratings. For instance, feature 604 and 606 may each be a region or combined to share a region of stacked gratings that appear darker than feature 630 which is a region of interleaved gratings brighter than and surrounding features 604 and 606.

The benefit of this architecture is that the line-width and pitch of the individual gratings forming the structure can be selected to be compliant with process density and feature size design rules. This allows the bright and dark regions to be made arbitrarily large in order to meet the needs of the processing tools alignment systems. Additionally, the structure can be made to comply with density requirement on multiple process layers simultaneously by adjusting the line/space ratio of the individual gratings as needed.

FIG. 6A also shows point 607, such as a common point shared by region or feature 606 and region or feature 630. Similarly, border 608 is an example of a common border shared by region or feature 606 and region or feature 630. It can be appreciated that all of the points or borders surrounding or between features 604 and 630, as well as those surrounding or between features 606 and 630 may be considered borders or points. Moreover, it can be appreciated that feature or region 630 surrounds and/or is adjacent to region or feature 604 and 606.

For example, feature 604 and 606 may be formed of stacked grating regions such as region 330 of FIG. 3, while feature 630 may be formed of interleaved grating regions such as region 430 of FIG. 4. In some cases, grates of features 604 and 606 may have the same pitch, a substantially similar pitch, or a different pitch than grates of feature 630.

FIG. 6B shows target 612 including features 614, 616, 618, 620 and 622 formed of gratings, as well as features 642, 644, 646 and 648 formed of different gratings. For example, features 614, 616, 618, 620 and 622 may be formed of stacked grating regions, such as those described for feature 604. Also, features 642, 644, 646 and 648 may be formed of interleaved gratings as described for feature 630. Features 614, 616, 618, 620, 622, 642, 644, 646 and 648 may be described as sharing a point with, sharing a border with, or adjacent to other features of target 612, as described with respect to target 602. For example, features 642, 616, 618 and 646 may all share common point 657. Also, features 646 and 622 may share common border 658.

Target 612 may include features having a border or size as described with respect to features of target 602. Also, features of target 612 may have a size as described above with respect to target 112 of FIG. 1. In some instances, features and/or borders of target 612 may be large enough to be collected, detected and/or identified by an optical microscope.

It can be appreciated that the contrast at a border or point between regions of target 602 and 612 can be equal to or greater than a contrast for points or borders of corresponding targets 102 and 122 of FIG. 1, due to the use of gratings on or over each other in the features. Specifically, the contrast between region 630 and region 606 at common border 608 and/or at point 607 may be sufficient to be collected, detected and/or identified by an optical microscope. Correspondingly, the contrast between feature 646 and 622 at border 658 and/or between feature 642, 616, 618 and 646 at common point 657 may be sufficient to be collected, detected and/or identified by an optical microscope.

Target 602 may be formed, for example, by creating a grating having a pitch in a region including the region where feature 604, 606 and 630 are shown. Then, a grating having an equal or substantially similar pitch may be formed stacked on the first grating in regions 604 and 606. Also, a grating having a pitch equal to or substantially similar to the first grating may be formed interleaved with the first grating in region 630. It can be appreciated that the order of forming the grating stacked on and the grating interleaved with the first grating can be reversed. Similarly, it can be appreciated that the grating formed stacked on the first grating and/or the grating formed interleaved with the first grating can be formed initially, and the first grating formed subsequently, such as where the first grating overlays the others. Also, it is considered that those gratings can be formed in any order, such as where the first grating is formed before or after the stacked grating in regions 604 and 606; and/or before or after the interleaved grating in region 430. In fact, it is possible for the gratings of target 602 to occupy 2, 3, 4, 5, 6, more layers, or a range of layers thereof of wafer 100, such as where any or all of the two layers of the stacked gratings in regions 604 and 606, and any or all of the interleaved gratings in region 630 are formed on a separate layer and/or separately. Thus, if each of those gratings were formed separately, the minimum total number of layers would equal two layers for feature 604, two layers for feature 606, and two layers for 630. It is also contemplated that each of those features could be formed of more than two layers, such as where each of those features has three or more layers of stacked or interleaved gratings. Thus, it can be appreciated that target 602 can be formed in multiple layers of wafer 100 of multiple layers of grating selected to provide the appropriate brightness, darkness and/or contrast among features 604, 606 and 630. Concepts similar to those described above with respect to target 602 apply to target 612 as well.

Also, it is considered that regions 604 and 606 may not have a common point, a common border or be adjacent to region 630, for some embodiments (e.g., not shown in FIG. 6). Specifically, space, or gratings other than stacked grating or interleaved grating may exist between feature 604 and 606, and feature 630.

Figure 7A:
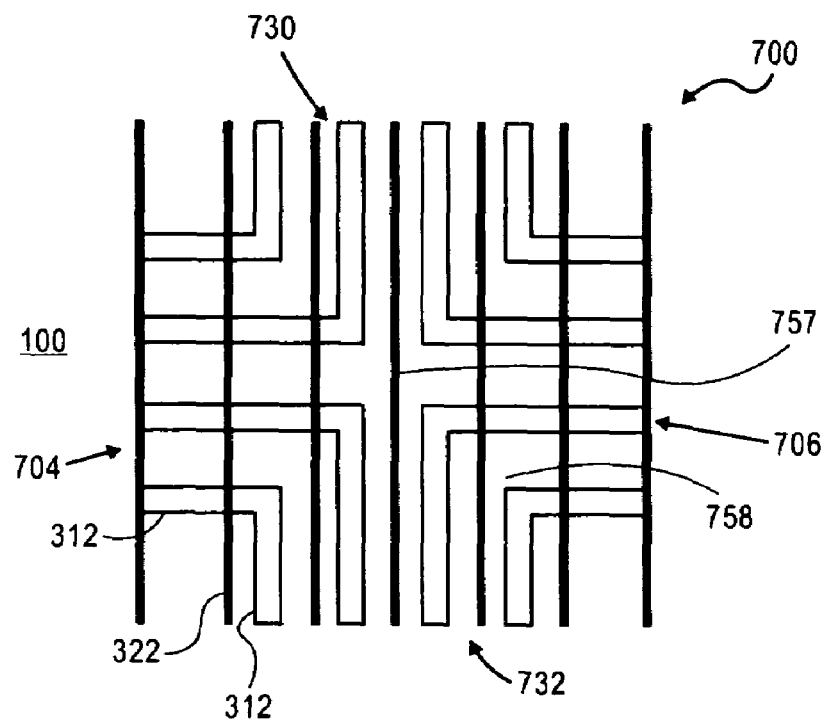
FIG. 7A is a schematic top perspective view of an example of a pattern recognition target (e.g., structure) having gratings in regions of a wafer that may be used for wafer alignment.

Likewise, a pattern recognition structures having grating structures can include "dark" regions formed from stacked gratings, and adjacent "bright" regions formed from interleaved gratings. A particular example of this is shown in FIG. 7A, which is a schematic top perspective view of examples of pattern recognition targets (e.g., structures) having gratings in regions of a wafer that may be used for wafer alignment. FIG. 7A shows target 700 including features 704, 706, 730 and 732, which may or may not have a common point, a common border and/or be adjacent to each other. For example, common point 757 may be shared by feature 704, 706, 730 and 732. Similarly, common border 758 may be shared by feature 706 and 732. Features 730 and 732 may include or be interleaved grating regions, such as those described above with respect to region 430. For example, FIG. 7A shows grates 322 and 312 interleaved in features 730 and 732. Alternatively, features 704 and 706 may be crossed grating regions, such as those described for region 530 of FIG. 5. Specifically, features 704 and 706 show gratings 322 and 312 crossed within those regions. Descriptions above with respect to forming gratings, layers of gratings, and contrast between features or regions of gratings, such as at common borders or points for target 602 apply to target 700 as well.

Figure 7B:
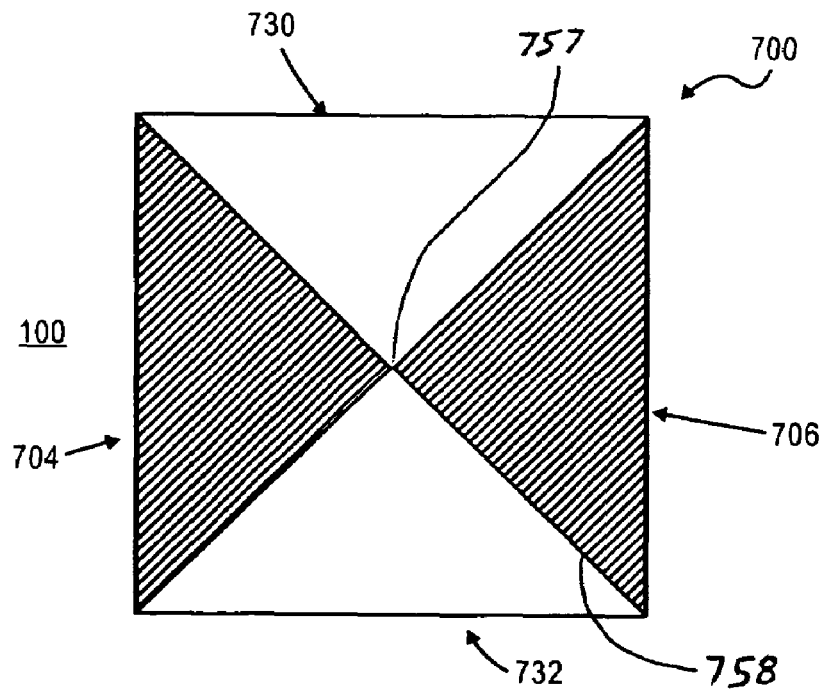
FIG. 7B is a schematic top perspective view of an example of a pattern recognition target (e.g., structure) having gratings in regions of a wafer that may be used for wafer alignment as seen by an inspection microscope.

For instance, FIG. 7B is a schematic top perspective view of an example of a pattern recognition target (e.g., structure) having gratings in regions of a wafer that may be used for wafer alignment as seen by an inspection microscope. Specifically, crossed grating regions of features 704 and 706 may appear neither dark, as per region 330 of FIG. 3, nor bright, as per region 430 of FIG. 4, but may appear grey, such as described for pattern 530 of FIG. 5A. On the other hand, features 730 and 732 may appear bright, as described above for feature 630 of FIG. 6. Thus, the grayness of regions 704 and 706, the brightness of regions 730 and 732, and/or the contrast at borders or points between those regions (such as at common point 757 and/or common border 758) may be sufficient for an optical microscope to collect, detect and/or identify target 700 or features of target 700 from light reflected and diffracted by the surface of wafer 100 at target 700.

The size or dimensions of features 604 and 606; features 614, 616, 618, 620 and 622; features 642, 644, 646 and 648; and 704, 706, 730 and 732, or other features described herein may be similar to that described above with respect to features 104 and 106 of FIG. 1. For example, border 608, or a border of a region, may have a length (e.g., a size) of between 0.5 micrometers and 20 micrometers. In other cases, border 608, a border of features 604 or 606, or a border described herein may have a length of 0.2, 0.3, 0.4, 0.8, 1.0, 2.0, 4.0, 8.0, 10, 20, 40, 80, 100, 200 any combination thereof, or in a range between any lengths and/or combinations thereof of micrometers in length. For example, a feature may have one or more borders of sufficient length such that the feature is detectable (e.g., long enough to be focused on, "seen", located, and/or identified) by an optical microscope. The border lengths described above may apply to an aggregate of borders of features used to form a single target.

It is considered that a target may include regions of any or all of stacked, interleaved, and crossed gratings. Moreover, a target may regions of stacked, interleaved, and/or crossed gratings as well as gratings other than regions of stacked, interleaved, and/or crossed gratings (e.g., a "normal", individual, or single layer of grating (see FIG. 2), or a solid feature (see FIG. 1)). For example, a region of crossed gratings may be added to target 602 adjacent to region 604 or 630. Likewise, a region of stacked gratings may be added to target 612 adjacent to region 614 or 642.

The following experimental data provides examples, without limitation thereto, of applications of the concepts described herein. Images of stacked, crossed, and interleaved grating structures were obtained from 300 mm wafers prior to an implant patterning operation using a registration metrology tool. 8-bit gray scale images were acquired using 0.3 and 0.7 NA optical microscopes with white light illumination. The image gray level of the various types of gratings was analyzed using standard image processing software. Table 1 summarizes the data. In this data, 255 corresponds to white and 0 corresponds to black. A difference of 50 to 70 gray levels in image intensity is seen between the stacked and interleaved gratings, which is more than adequate for pattern recognition purposes. For comparison, the "B", "C", "D", "E" letters (e.g., letters written on a wafer as a solid pattern) on a 300 mm wafer prior to an implant patterning operation, are drawn as solid 1 um wide lines on a blank background and appear approximately 50 gray levels darker than their surroundings (according to the registration tool using 0.3 NA inspection). Hence, in this example, the contrast offered by the grating structure is equal to or greater than that of a conventional target.

According to embodiments, shapes other than gratings and/or gratings having square cross sections are contemplated, such as other shapes having optical properties that increase or decrease and amount of light reflected back to an aperture by one or more layers of the shapes on top of each other in a wafer surface. For example, triangles, squares, circles, waves, having a size smaller than the resolution limit of an inspection microscope may be used instead of gratings. Similarly, gratings having a hemispherical, triangular, trapezoidal, rectangular, upside down "U", cross section shape may be used.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method of creating an optical pattern recognition target on a wafer comprising:
    forming a first individual grating in a first region of the wafer;
    forming a second individual grating over the first grating in the first region;
    forming the first grating in a different second region of the wafer;
    forming a third grating over the first grating in the second region, wherein the first region shares one of a common border and a common point with the second region that creates a contrast when exposed to lights;
    exposing the first region and the second region to light;
    collecting light reflected and diffracted by the target within a numerical aperture of a lens of an inspection microscope; and
    indexing the wafer according to the collected light, wherein indexing comprises identifying the contrast from the collected light.

2. The method of claim 1, wherein the first grating is an individual grating formed during first lithographic patterning process for forming semiconductor device circuitry features, and the second grating is an individual grating formed during a different second lithographic patterning process for forming semiconductor device circuitry features.

3. The method of claim 1, wherein the first grating and the second grating are formed during a device fabrication process.

4. The method of claim 1 wherein the first region comprises stacked grating including a plurality of grates of the second grating parallel in direction to a plurality of grates of the first

TABLE 1

| Structure | NA of inspection microscope | Gray level in stacked configuration | Gray level in interleaved configuration | Gray level in crossed configuration |
|---|---|---|---|---|
| Isolation patterning (130 nm line/320 nm pitch) + gate patterning (80 nm line/320 nm pitch), viewed prior to an implant patterning operation | 0.3 | 65 | 115 | — |
| Isolation patterning (130 nm line/320 nm pitch) + gate patterning (80 nm line/320 nm pitch), viewed prior to an implant patterning operation | 0.7 | 60 | 130 | 80 | grating, and a portion of each grate of the second grating is super-positioned over a portion of a corresponding grate of the first grating; the second region comprises an interleaved grating including a plurality of grates of the third grating parallel in direction to a plurality of grates of the first grating, and each grate of the third grating is superpositioned over a space between two grates of the first grating; and the border provides a contrast between a brightness of the stacked grating and a darkness of the interleaved grating when light is reflected from the first and second regions.

5. An optical pattern recognition target on a wafer comprising:
   a first individual grating in a first region of the wafer;
   a second individual grating over the first grating;
   wherein the first region comprises a crossed grating including a plurality of grates of the second grating perpendicular in direction to a plurality of grates of the first grating, and a portion of a grate of the second grating is super-positioned over a portion of each grate of the first grating, wherein the first grating and the second grating have a substantially similar pitch; and
   a second region of the wafer having a stacked grating including a plurality of grates of the second grating parallel in direction to a plurality of grates of the first grating, and a portion of each grate of the second grating is super-positioned over a portion of a corresponding grate of the first grating, wherein the crossed grating and the stacked grating share a common border that creates a contrast when exposed to light.

6. The target of claim 5 wherein each of first grating and the second grating are individual gratings formed in one of a photoresist on the wafer and a layer of material of the wafer.

7. The target of claim 5, wherein the region comprises an interleaved grating including a plurality of grates of the second grating parallel in direction to a plurality of grates of the first grating, and each grate of the second grating is super-positioned over a space between two grates of the first grating.

8. The target of claim 5, wherein the region is a first region, and further comprising:
   a second region including an interleaved grating adjacent to or sharing a border with the first region, the interleaved grating including a plurality of grates of a third grating substantially similar pitch and parallel in direction to a plurality of grates of the first grating, and each grate of the third grating is super-positioned over a space between two grates of the first grating.

9. The target of claim 8, further comprising a plurality of alternating first regions and second regions that optically contrast when exposed to light, wherein adjacent alternating regions share a common border or point on the wafer.

10. The target of claim 8, wherein the first and second region each comprise at least 5 first grates having a first pitch and at least five second grates having a second pitch, and the first pitch is within two percent of the second pitch.

11. The target of claim 10, wherein each region has a size of at least 10 microns in one direction, a diffraction efficiency of at least 10 percent, and a duty cycle of between 20 and 80 percent.

12. The target of claim 5, wherein the region has an area of greater than 50 microns squared ($\mu m^2$) and the pitch is between 300 nanometers and 1 micrometer.

13. The target of claim 5, wherein the first and second gratings do not physically contact electrically conductive features of circuitry on the wafer, and include grates that are uniformly spaced at a similar pitch of between 300 nanometers and 1 micrometer and are substantially similar in shape and size.

14. A wafer alignment system to index a wafer comprising:
   an inspection microscope to inspect a wafer, the microscope including a light generator to expose the wafer to a light having a wavelength and an optical microscope to collect the incident light reflected by the wafer;
   the wafer including alternating regions of stacked and interleaved gratings having a similar pitch and sharing at least one border that creates a contrast when exposed to light; and a processor to index the wafer wherein indexing comprises detecting the contrast from the border in the collected incident light.

15. The system of claim 14, wherein the structures comprise a plurality of superimposed grating patterns on multiple processing layers, on top of each other, and having a similar pitch below the resolution limit of an inspection microscope, wherein the pitch causes a portion of an incident light of the microscope to diffract into a numerical aperture of the microscope during examination of the wafer by the microscope.

16. The system of claim 14, wherein the structures comprise a plurality of superimposed grating patterns on multiple process layers, wherein the grates of a first pattern are interleaved between and do not overlap with grates of a second grating pattern to cause a fraction greater than $1/10$ of the incident light to be diffracted back into the numerical aperture.

17. The system of claim 14, wherein the structures comprise a plurality of stacked grating patterns on multiple process layers, wherein the grates of a first pattern are stacked over and overlap with grates of a second grating pattern to cause a fraction greater than $1/10$ of the incident light to be diffracted out of the numerical aperture.

18. The system of claim 14, wherein the structures comprise a plurality of gratings on multiple process layers overlying each other, wherein the gratings comprise a first grating at a first pitch and a second grating at a second pitch overlaying the first grating and at an angle substantially perpendicular to the angle of the first grating.

* * * * *